(12) United States Patent
Puleo

(10) Patent No.: US 6,384,385 B1
(45) Date of Patent: May 7, 2002

(54) PROCESS AND DEVICE FOR THE THERMAL CONDITIONING OF ELECTRONIC COMPONENTS

(75) Inventor: Mario Puleo, Borgosesia (IT)

(73) Assignee: Agilent Technologies Inc., Palo Alto, CA (US)

( * ) Notice: Subject to any disclaimer, the term of this patent is extended or adjusted under 35 U.S.C. 154(b) by 0 days.

(21) Appl. No.: 09/695,244

(22) Filed: Oct. 25, 2000

(30) Foreign Application Priority Data

Oct. 26, 1999 (IT) .......................................... TO99A0930

(51) Int. Cl.[7] ................................................ H05B 1/02
(52) U.S. Cl. ........................ 219/497; 219/209; 219/210; 219/501; 331/69; 331/176
(58) Field of Search ................................. 219/209, 210, 219/497, 495, 501, 494; 310/314–318, 313; 331/69, 176

(56) References Cited

U.S. PATENT DOCUMENTS

| | | | | |
|---|---|---|---|---|
| 3,158,821 A | * | 11/1964 | Sulzer ......................... 331/69 |
| 3,550,006 A | * | 12/1970 | Harner ........................ 219/210 |
| 3,970,818 A | * | 7/1976 | Friedrichs ................... 219/210 |
| 4,396,892 A | * | 8/1983 | Frerking et al. .............. 331/69 |
| 4,687,163 A | * | 8/1987 | Ringer ........................ 246/428 |
| 6,127,661 A | * | 10/2000 | Fry ............................. 219/497 |

* cited by examiner

*Primary Examiner*—Mark Paschall

(57) ABSTRACT

The component, located inside a corresponding package, is associated with a first heat sensor, located in proximity to the component inside the package, together with a second heat sensor. A thermal conditioning element is controlled in such a way as to keep the temperature of the first sensor at a level identified by a reference signal (rifv).

The second sensor is associated with the package in such a way as to generate a second temperature signal indicating the external temperature, and the aforesaid reference signal (rifv;) is modified as a function of the said second temperature signal, providing effective temperature control of the component.

22 Claims, 2 Drawing Sheets

Known Art

PROCESS AND DEVICE FOR THE THERMAL CONDITIONING OF ELECTRONIC COMPONENTS

BACKGROUND OF INVENTION

The present invention tackles the problem of the thermal conditioning of electronic components, and has been developed with particular regard to possible application to the temperature control of semiconductor laser modules.

In this field of application it is important to ensure the stability of the operating conditions. This is particularly true of wavelength division multiplexing (WDM) systems, and especially for high-density (DWDM) systems, where it is necessary to control the temperature of the laser accurately, since the emission frequency depends directly on the temperature of the component, with a coefficient of proportionality of the order of approximately −10 GHz/°C. Since rather small channel spacings, of the order of 50 GHz for example, are used in the most recent systems, it is necessary to ensure temperature stability in a range of values below 1° C.

To achieve the necessary temperature stabilization, circuits have been developed which use a temperature-sensitive resistor (for example an NTC thermistor) as the sensor and a thermoelectric cell (Peltier cell) as the temperature control or conditioning element. These circuits can be used to stabilize the temperature of the sensor within a range of 0.5° C. without any special circuit arrangements.

The control circuit regulates the current in the Peltier cell in such a way as to keep the sensor reading equal to a reference reading. However, since the position of the temperature sensor does not exactly coincide with that of the laser diode (referred to simply as the "laser" in the following text), there may be a temperature difference between the laser and the sensor, which depends on the structure of the package containing the component. Consequently, the actual temperature of the laser can vary considerably, particularly with a change in external temperature, despite the correct operation of the temperature control. While the temperature of the sensor is kept constant by the control circuit, there may be, depending on the particular structure of the package, either conditions in which the actual temperature of the laser rises with an increase in the temperature of the package, or conditions—most frequently encountered in commercial components—in which the temperature of the laser falls with an increase in the external temperature.

A situation of this type is shown schematically in FIG. 1 of the attached drawings, which shows three parallel vertical lines, each corresponding to an ideal temperature scale. Moving from left to right, we find three scales of possible temperature values, corresponding, respectively, to the package, the temperature sensor (thermistor) and the laser: thus it can be seen that, even if the temperature of the sensor is kept constant, the variations of temperature in the package cause corresponding variations of the temperature of the laser and therefore a variation of the operating conditions of the laser.

The paper by A. Adachi, S. Kaneko, J. Yamashita and K. Kasahara, "Low-frequency drift laser-diode module for a wide temperature range using two thermistors", published on pages 109 and 110 of the OFC/IOOC '93 Technical Digest describes a solution (taken as the model for the preambles of claims 1 and 7) in which two thermistors, one located in proximity to the laser and the other at a certain distance from the first thermistor, are positioned on the base plate carrying the laser. The different temperatures read by the two thermistors are used to produce a kind of estimate or interpolation of the temperature difference present between the first thermistor and the laser.

Even without a discussion of the real effectiveness of a solution of this kind, it is immediately apparent that it necessarily entails the provision of the second thermistor during the manufacture of the package comprising the laser. This solution is therefore not applicable to commercial components, which are supplied already sealed into their packages, or, in other words, when it is no longer possible to modify the base plate of the component.

SUMMARY OF INVENTION

The object of the present invention is to overcome the aforesaid disadvantage with a solution which is also applicable to commercial components (and therefore to those already enclosed in their packages), without the need to make modifications inside the package, and which, in all cases, provides very precise temperature control.

According to the present invention, this object is achieved by means of a process having the characteristics claimed specifically in the following claims.

The invention also relates to the corresponding device.

Briefly, the solution according to the invention provides a control circuit which is designed to make the reading of the sensor equal to that of a reference made to vary as a function of the external temperature, measured by another sensor preferably located in contact with the package.

In general, the references made—both here and in the following claims—to the temperature conditioning of electronic components are intended to allow for the fact that the possible range of application of the invention is not in any way restricted to the cooling of a laser module by means of Peltier cells, although reference has been and will be made to this application by way of example.

In particular, the solution according to the invention is suitable for use for a thermal conditioning (temperature control) operation intended for cooling a component which tends to heat up during operation and/or to heat a component whose temperature—for a wide range of reasons—is to be raised (for example, in order to obtain a fixed operating temperature even in the presence of a lower external temperature). Clearly, however, it is possible that, in many case, the same component may be concerned, being intended to be alternatively cooled and heated in the presence of different environmental and/or operating conditions. The means of thermally conditioning the component (shown schematically here in the form of a Peltier cell, intended primarily to cool the component) can therefore be produced and/or controlled (according to entirely known principles) in such a way that the component can be heated, in addition or as an alternative to the cooling.

This component can consist of a component of any kind or nature.

The invention will now be described, purely by way of example and without restrictive intent, with reference to the attached drawings in which:

DETAILED DESCRIPTION OF DRAWINGS

Figure 2:
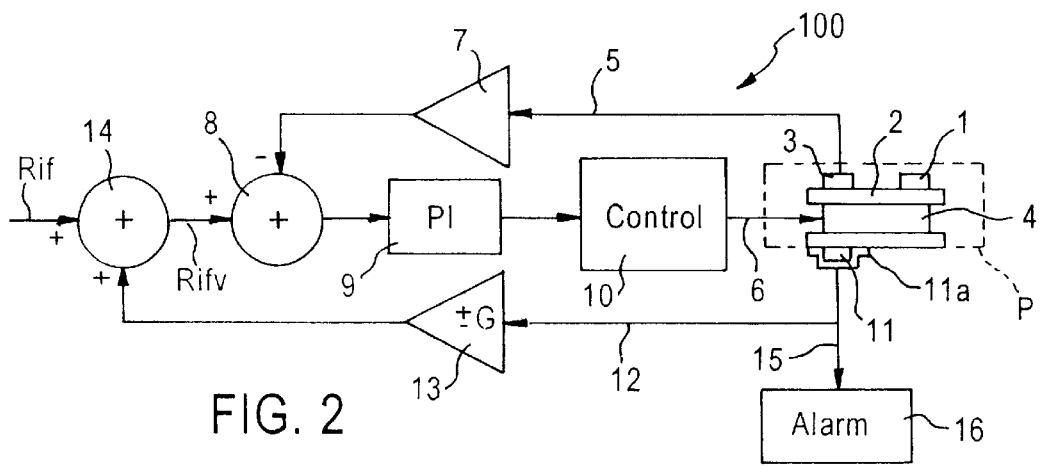
FIG. 2 shows, in the form of a block diagram, an example of the embodiment of a device according to the invention.

In the diagram in FIG. 2, the circuit according to the invention is indicated as a whole by 100. The numeric reference 1 indicates an electronic component consisting, in the illustrated example of embodiment, of a semiconductor laser, such as a distributed feedback (DFB) laser. The laser 1 is mounted on a base plate 2 together with a temperature sensor 3. The latter typically consists of a thermistor mounted on the plate 2 in proximity to the laser 1.

The numeric reference 4 indicates a thermoelectric cell (Peltier cell) acting as a means of thermal conditioning of the laser 1 with the effect of cooling the laser. Finally, the reference P indicates the package which encloses the various elements mentioned above.

The set of parts described corresponds in a general way to a commercially available component, sealed inside the package P. This package may have different configurations, which can produce different behaviours in terms of the ratio between the temperature of the package P and the temperature of the laser 1. In particular, it may happen that the temperature of the laser 1 decreases with an increase in the external temperature (behaviour illustrated in FIG. 1), or that the temperature of the laser 1 increases with an increase in the external temperature; all this is true even if the temperature of the internal sensor (sensor 3) remains constant.

The package P is also provided with pins or similar contact elements which enable it to be connected electrically to the other elements of the circuit.

Some of these pins (not explicitly shown in the drawings) correspond to the control lines for the laser 1 and to the various functions of power supply to the components associated with it.

Additionally, at least two other pins corresponding to the lines indicated by 5 and 6 respectively are provided.

The line 5 is a line on which the output signal of the sensor 3 is present. This output signal (essentially a signal indicating the temperature of the sensor 3) is sent to the input of a variable-gain element 7, such as an amplifier, whose output signal is sent to the inverting input of an addition node 8. A reference signal rifv, generated according to principles illustrated in greater detail below, is supplied to the non-inverting input of the node 8.

The output signal of the node 8, corresponding to a deviation or error signal, indicating the difference between the reference signal rifv and the temperature signal generated by the sensor 3 (scaled by the value of the gain of the element 7), is sent to the input of a proportional integral circuit 9. The output signal of the circuit 9 is used to drive a control circuit 10 designed to generate the power supply current for the thermoelectric cell 4.

The set of elements indicated by the references 5 to 10 also corresponds to a solution known in the art: in practice, this is a feedback loop whose function is to keep the temperature level measured by the sensor 3 constant at a predetermined value (determined by the reference signal rifv applied to the non-inverting input of the node 8).

As stated in the introductory part of the description, this temperature control action, since it relates to the sensor 3 (whose position, although close to that of the laser 1, is not coincident with it), cannot ensure that the temperature of the laser 1 is kept at a constant level. The operating conditions of the laser 1 are therefore affected by the variations of the external temperature, particularly at the package P.

In the solution according to the invention, the laser module is associated with a further temperature sensor 11, typically positioned on the package P or, in any case, in such a way as to make it sensitive to the external temperature.

For more satisfactory operation of the circuit, the external sensor 11 must provide a linear indication of the temperature. A suitable sensor may be the LM 35 temperature sensor made by National Semiconductors.

Preferably, the sensor 11 is located on the package P, with an arrangement promoting conditions of low resistance to heat exchange between the sensor 11 and the package P. For example, it is possible to secure the sensor 11 to the package P by means of a bracket 11a, or use alternative solutions such as an adhesive joint. All this is true without prejudice to the fact that the application of the further sensor 11 does not require any particular modification to be made to the package P, and therefore the invention is applicable to any commercial component.

The output signal of the sensor 11, which constitutes another temperature signal, is sent by means of a line 12 to a further variable-gain element 13, usually similar to the element 7. The signal leaving the element 13 is supplied to one of the inputs of a further addition node 14. The node 14 has another input to which a reference signal, called rif, is applied. The output signal of the node 14 forms the reference signal rifv supplied to the input of the node 8 of the control loop described above.

The reference signal rif is set in such a way that it determines the actual temperature at which the laser 1 is to be maintained.

The signal supplied from the sensor 11 (through the line 12 and the variable-gain element 13) is applied to the other input of the node 14 in such a way as to induce in the variable reference signal rifv variations representing the temperature variations measured by the sensor 11. Thus the reference signal rifv applied to the input of the node 8 varies and causes a corresponding variation in the temperature at which the sensor 3 is maintained, while on the other hand the temperature of the laser 1 is kept constant. All this is true although the sensor 3 and the laser 1 are located at a certain distance from each other.

Figure 1:
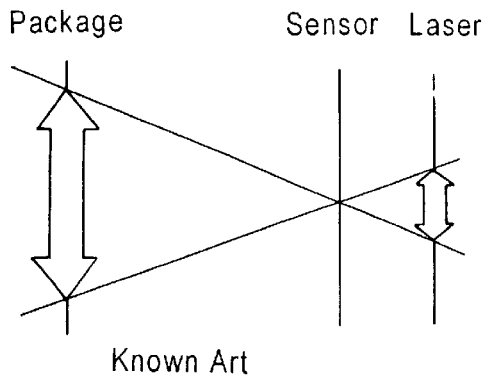
FIG. 1, showing the intrinsic disadvantages of the solutions according to the known art, has already been discussed.
Figure 3:
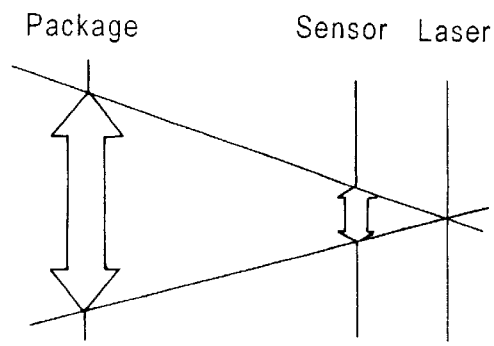
FIG. 3 shows, in a format essentially similar to that of FIG. 1, the operating principles of the solution according to the invention.

These modes of operation are shown schematically in FIG. 3, whose arrangement reproduces the arrangement of FIG. 1 described above.

Preferably, the output signal of the sensor 11, taken from a line 15, is also sent towards a thermal alarm module 16. The latter is capable of detecting the condition in which the temperature measured by the sensor 11 has reached a threshold level corresponding to a temperature beyond which reliable operation of the laser 1 can no longer be counted on. In these conditions, the module 16 can operate in such a way as to take the action considered necessary (turning off the laser 1 and/or emitting a warning signal towards the exterior).

The operation of calibrating the gain of device 13 can be carried out by initially making the circuit operate in a conventional way, in other words with the external temperature sensor (sensor 11) turned off.

In these conditions, it may happen that, for example, when the temperature external to the package P is varied over a range from 10° C. to 60° C., the temperature of the thermistor 3 remains constant (within 0.1° C. for example), while the emission frequency of the laser 1 varies, for example, by approximately 15 GHz, corresponding to a variation of 1.5° C. in the real temperature of the laser, as shown in diagrams 4a and 4b.

The reported data relate to a commercial DFB laser mounted on a board subjected to heat cycles between 10° C. and 60° C., in both directions, with a rate of 1° C./min., using a heating chamber. The figures show, as functions of the ambient temperature (the horizontal scales in both diagrams), the variations of the temperature and consequently the resistance of the thermistor 3 (the vertical scale on the right and left respectively in diagram 4a) and the frequency of the optical signal emitted by the laser 1 (the vertical scale in diagram 4b) measured by means of a wavemeter.

The variations of the frequency of tile optical signal are evident.

When the difference between the temperature of the internal sensor 3 and the actual temperature of the component to be controlled (the laser 1) is known, it is then necessary to set a reference value rifv such that this difference is compensated.

This procedure makes it possible to calculate (and regulate) the gain of the element 13 with sufficient precision: this value can, however, be additionally optimized in an experimental way by observing the residual drift of the emission frequency of the laser 1.

The slope of the "Frequency vs. Ambient temperature" diagram (FIG. 4b) sets the sign (inverting or non inverting) of the gain of device 13.

Figure 4A:
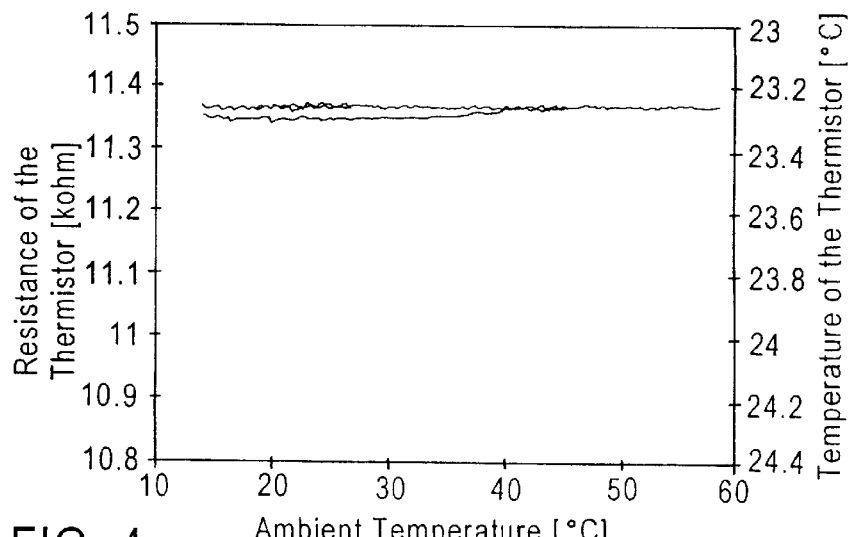
FIGS. 4a and 4b show the operating characteristics of a conventional device for the temperature conditioning of an electronic component such as a semiconductor laser.
Figure 4B:
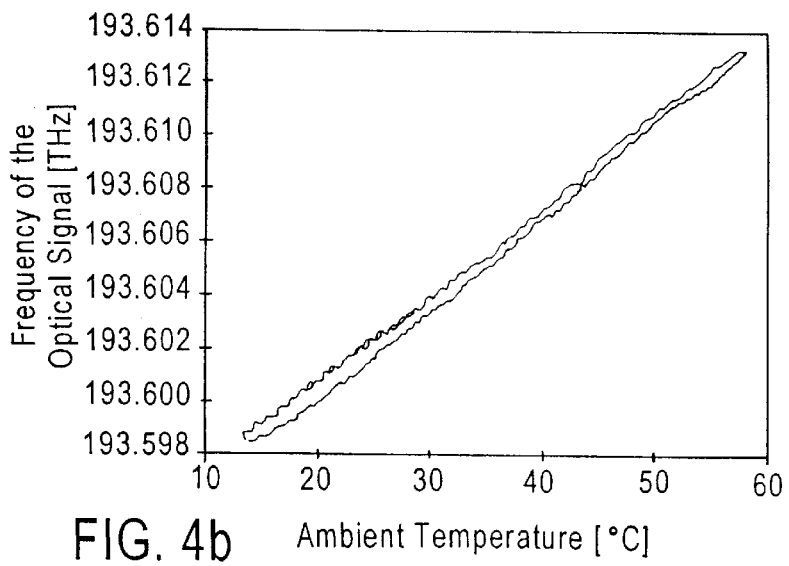
Figure 5A:
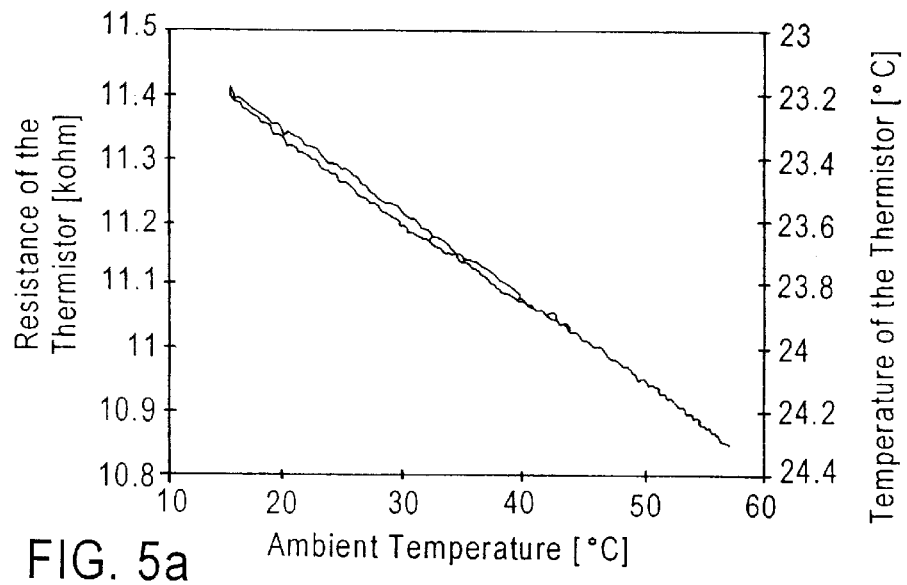
FIGS. 5a and 5b show the results which can be achieved with the device according to the invention in the temperature conditioning of the electronic component to which FIGS. 4a and 4b relate.
Figure 5B:
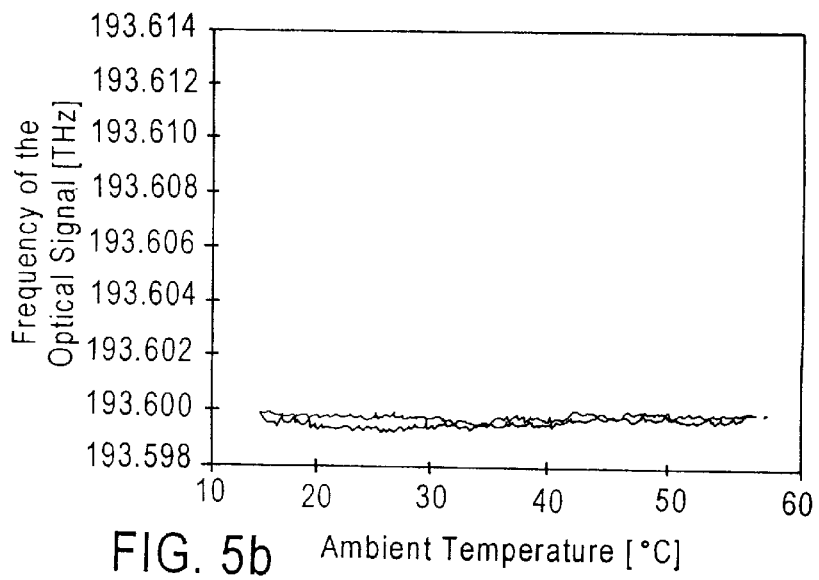

The diagrams in FIGS. 5a and 5b show the experimental results achieved with the circuit shown in FIG. 2 in the same test conditions as those used for plotting the diagrams in FIGS. 4a and 4b. In this case, the circuit of FIG. 2 was made to operate with the sensor 11 connected in such a way that it could intervene in the operation of the circuit according to the criteria described above.

In this case also, the figures show, as functions of the ambient temperature (the horizontal scales in both diagrams), the variations of the temperature and consequently the resistance of the thermistor 3 (the vertical scale on the right and left respectively in diagram 5a) and the frequency of the optical signal emitted by the laser 1 (the vertical scale in diagram 5b) measured by means of a wavemeter.

The stabilizing effect on the emission wavelength (the maximum deviation found is of the order of 800 MHz) is clearly apparent.

Naturally, the details of construction and the forms of embodiment can be varied considerably from what has been described and illustrated, provided that the principle of the invention is retained, without departing from the scope of the present invention.

What is claimed is:

1. A process of thermal conditioning of an electronic component located inside a package, comprising the operations of:
   providing means for the thermal conditioning of the said component,
   associating with the component a first heat sensor located in proximity to the component inside the said package, together with a second heat sensor, the said first and second heat sensors being adapted for detecting, respectively, a first and a second temperature, and
   controlling the said means of thermal conditioning as a function of the said first and said second temperature,
   the process comprising the operations of:
      generating a first temperature signal from the said first sensor,
      associating the said second sensor with the said package in such a way as to generate, from the said second sensor, a second temperature signal indicating the temperature external to the package, and
      controlling the said means of thermal conditioning on the basis of the said first temperature signal in such a way as to keep the temperature of the said first sensor at a level identified by a reference signal (rifv), and
      modifying the said reference signal (rifv) as a function of the said second temperature signal.

2. The process of claim 1, comprising the operation of mounting the said second sensor on the said package.

3. The process of claim 2, comprising the operation of mounting the said second sensor on the said package in conditions of low resistance to heat exchange between the package and the second sensor.

4. The process of the claim 1, comprising the operation of controlling the said means of thermal conditioning by means of a feedback loop in which the feedback signal is determined on the basis of the said first temperature signal and the said means of thermal conditioning are controlled as a function of the deviation found between the said feedback signal and the said reference signal (rifv).

5. The process of claim 1, wherein the said reference signal (rifv) is generated in the form of a variation produced in a given value (rifv) on the basis of the said second temperature signal.

6. The process of claim 1, comprising the operation of comparing the said second temperature signal with a given threshold in order to generate a signal indicating that the said external temperature has reached a limit value.

7. A device for the thermal conditioning of an electronic component located inside a package, the device comprising:
   a thermal conditioning element for the thermal conditioning of the said component,
   a first heat sensor, located in proximity to the component inside the said package, together with a second heat sensor, the said first and second heat sensors being adapted for detecting, respectively, a first and a second temperature, and
   a control unit for controlling the said thermal conditioning element as a function of the said first and said second temperature,
   wherein
      the said first and the said second sensor generate, respectively, a first and a second temperature signal,
      the said second sensor is associated with the said package, as a result of which the said second temperature signal indicates the temperature external to the package, and
      the said control unit is configured in such a way as to control the said thermal conditioning element on the basis of the said first temperature signal in such a way as to keep the temperature of the said first sensor at a level identified by a reference signal (rifv), the said reference signal (rifv) being modified as a function of the said second temperature signal.

8. The device of claim 7, wherein the said second sensor is mounted on the said package.

9. The device of claim 8, wherein the said second sensor is mounted on the said package in conditions of low resistance to heat exchange between the package and the second sensor.

10. The device of claim 7, wherein the said control unit comprise a feedback loop in which the feedback signal is determined on the basis of the said first temperature signal and the said means of thermal conditioning are controlled as a function of the deviation found between the said feedback signal and the said reference signal (rifv).

11. The device of claim 7, comprising a node in which the said reference signal (rifv) is generated in the form of a variation produced in a given value (rif) on the basis of the said second temperature signal.

12. The device of claim 11, wherein a variable-gain element acting on the said second temperature signal is interposed between the said second sensor and the said node.

13. The device of claim 7, comprising a module for comparing the said second temperature signal with a given threshold in order to generate a signal indicating that the said external temperature has reached a limit value.

14. A method of thermal conditioning an electronic component located inside a package with (a) a thermal conditioner for the component, (b) a first heat sensor in proximity to the component so that the first heat sensor derives a first signal primarily responsive to the temperature of the component and affected secondarily by ambient temperature outside the package and (c) a second heat sensor positioned to be responsive to temperature external to the package so that the second heat sensor derives a second signal indicative of the external temperature, the method comprising controlling the thermal conditioner in response to the first signal and a reference signal for a reference temperature of the first sensor so the temperature of the first sensor is maintained at the reference temperature, and modifying the reference signal in response to the second signal.

15. The method of claim 14 further including deriving another reference signal for the temperature of the component, and combining said another reference signal for the temperature of the component and the second signal to derive the reference signal for the reference temperature of the first sensor.

16. The method of claim 15 wherein the first signal and the reference signal for the reference temperature of the first sensor are combined to derive an error signal, further including performing a proportional integral operation on the error signal to derive a processed error signal, and supplying the processed error signal to the conditioner.

17. The method of claim 14 further including activating an alarm in response to the second signal indicating the external temperature exceeds a predetermined level.

18. In combination, a package for an electronic component, an electronic component inside the package, a first thermal sensor inside the package for deriving a first signal primarily indicative of the temperature of the component and secondarily affected by ambient temperature outside the package a second thermal sensor associated with the package and located outside the package to be responsive to temperature outside of the package and for deriving a second signal indicative of ambient temperature outside the package, a thermal conditioner for the temperature of the first sensor and the component, the thermal conditioner being located inside the package a reference signal source for the temperature of the component, a controller for the thermal conditioner connected to be responsive to the first and second signals and the reference signal source, the controller being arranged to be responsive (a) to the second signal and the reference signal source for deriving a reference signal for the temperature of the first sensor, and (b) to the first signal and the reference signal for the temperature of the first sensor for deriving an error signal for controlling the conditioner, the controller including circuitry responsive to the error signal for causing the conditioner to maintain the first sensor at a temperature corresponding to the reference signal for the temperature of the first sensor.

19. The combination of claim 18 wherein the component is a laser having a frequency dependent on the ambient temperature and the temperature in the package.

20. The combination of claim 18 wherein the circuitry includes a proportional integral circuit.

21. The combination of claim 18 wherein the second sensor is located on the package with an arrangement promoting conditions of low resistance to heat exchange between the second sensor and the package.

22. The combination of claim 21 wherein the second sensor has a linear temperature versus resistance characteristic.

* * * * *